(12) United States Patent
Tu et al.

(10) Patent No.: US 10,783,959 B2
(45) Date of Patent: Sep. 22, 2020

(54) METHOD OF COMPENSATING CHARGE LOSS AND SOURCE LINE BIAS IN PROGRAMING OF NON-VOLATILE MEMORY DEVICE

(71) Applicant: Powerchip Technology Corporation, Hsinchu (TW)

(72) Inventors: Chun-Yi Tu, Hsinchu County (TW); Ming-Chang Tsai, Hsinchu County (TW); Jui-Lung Weng, Hsinchu County (TW)

(73) Assignee: Powerchip Semiconductor Manufacturing Corporation, Hsinchu (TW)

( * ) Notice: Subject to any disclaimer, the term of this patent is extended or adjusted under 35 U.S.C. 154(b) by 0 days.

(21) Appl. No.: 16/402,237

(22) Filed: May 3, 2019

(65) Prior Publication Data

US 2020/0219561 A1 Jul. 9, 2020

(30) Foreign Application Priority Data

Jan. 9, 2019 (TW) .............................. 108100787 A

(51) Int. Cl.
| | | |
|---|---|---|
| G11C 11/56 | (2006.01) |
| G11C 29/52 | (2006.01) |
| G11C 16/10 | (2006.01) |
| G11C 5/14 | (2006.01) |
| G11C 16/34 | (2006.01) |
| G11C 16/26 | (2006.01) |
| G11C 16/16 | (2006.01) |

(52) U.S. Cl.
CPC .......... *G11C 11/5628* (2013.01); *G11C 5/147* (2013.01); *G11C 11/5621* (2013.01); *G11C 16/10* (2013.01); *G11C 16/16* (2013.01); *G11C 16/26* (2013.01); *G11C 16/3459* (2013.01); *G11C 29/52* (2013.01)

(58) Field of Classification Search
CPC . G11C 11/5628; G11C 11/5621; G11C 16/26; G11C 16/3459; G11C 16/10; G11C 5/147
See application file for complete search history.

(56) References Cited

U.S. PATENT DOCUMENTS

2014/0059406 A1\* 2/2014 Hyun ................... G11C 11/5621
714/773

\* cited by examiner

*Primary Examiner* — Sultana Begum
(74) *Attorney, Agent, or Firm* — Winston Hsu

(57) ABSTRACT

A method of compensating charge loss and source line bias in programing of non-volatile memory device including the steps of reading a previous program page with a low reference voltage to make an original previous program pattern, merging the original previous program pattern and a current program pattern to make a merged program pattern, reading the previous program page with a high reference voltage to make a verified previous program pattern, and merging the verified previous program pattern and the merged program pattern to make a compensated current program pattern.

9 Claims, 7 Drawing Sheets

METHOD OF COMPENSATING CHARGE LOSS AND SOURCE LINE BIAS IN PROGRAMING OF NON-VOLATILE MEMORY DEVICE

BACKGROUND OF THE INVENTION

1. Field of the Invention

The present invention generally relates to a method of programming a non-volatile memory device, and more specifically, to a method of programming a non-volatile memory device to compensate charge loss and source line bias in multiple program application.

2. Description of the Prior Art

Solid-state memory capable of non-volatile storage of charge, particularly in the form of electrically-erasable programmable read-only memory (EEPROM) and flash EEPROM packaged as a small form factor card, has recently become the storage of choice in a variety of mobile and handheld devices, notably information appliances and consumer electronics products. Unlike RAM (random access memory) that is also solid-state memory, flash memory is non-volatile, retaining its stored data even after power is turned off. In spite of the higher cost, flash memory is increasingly being used in mass storage applications. Flash memory, both embedded and in the form of a removable card are ideally suited in the mobile and handheld environment because of its small size, low power consumption, high speed and high reliability features.

EEPROM and electrically programmable read-only memory (EPROM) are one kind of non-volatile memory that can be erased and have new data written or "programmed" into their memory cells. Both utilize a floating (unconnected) conductive gate, in a field effect transistor structure, positioned over a channel region in a semiconductor substrate, between source and drain regions. A control gate is then provided over the floating gate. The threshold voltage characteristic of the transistor is controlled by the amount of charge that is retained on the floating gate. That is, for a given level of charge on the floating gate, there is a corresponding voltage (threshold) that must be applied to the control gate before the transistor is turned "on" to permit conduction between its source regions and drain regions.

One conventional issue of non-volatile memory device is charge loss. In a programmed cell, the respective amounts of accumulated charge are ideally retained within some discrete quanta ranges that are separated by a sufficient distance such that read voltage thresholds applied to the cells can clearly and accurately discern the programmed state the cell. While operable to store and retrieve data in a fast and efficient manner, programmed flash memory cells can experience changes ("charge drift") in the total amount of accumulated charge over time. A variety of environmental and operational parameters can influence the rate of charge drift in a flash memory cell. In particular, a phenomenon sometimes referred to as "charge loss" can arise when maintaining a programmed state of the memory cells for a certain time period. During this time period (retention time), the charge levels in the cells shift down as charge leaks from the floating gates. For example, intrinsic charge loss is an immediate leakage of electrons from the floating gate, closest to the tunnel oxide, after a programming pulse.

FIG. 1A shows the phenomenon of charge loss in programming a memory device in a form of population distribution (i.e. bit count) vs. read voltage coordinate system. $V_L$ in the figure is a lowest distribution voltage in an ideal state population distribution (e.g. high "H" state depicted as a dashed curve), and $V_R$ in the figure is a reference voltage, ex. 0V, as a voltage breakpoint level that demarcates the read voltage into a first memory state (e.g. high "H" state) or a second memory state (e.g. low "L" state). The spacing $M_1$ between the lowest distribution voltage $V_L$ and the reference voltage $V_R$ is the predetermined judge margin provided to prevent the read error. It can be seen in the figure that the charge loss issue would result in a portion of the state population tailing toward the judge margin region (depicted as a solid line). This will result in some of the "H" states (less conducting) being mistakenly demarcated as "L" states (more conducting). In other word, the charge loss issue may decrease the judge margin (e.g. $M_1 \rightarrow M_2$) between different memory states and increase the possibility of read error.

The other conventional issue of non-volatile memory device is the source line bias error. This is particular acute for memory architecture where a large number of memory cells have their sources tie together in a source line to ground. Parallel sensing of these memory cells with common source would result in a substantial current through the source line. Owing to finite resistance in the source line, this in turn results in an appreciable potential difference between the true ground and the source electrode of each memory cell. During sensing, the threshold voltage supplied to the control gate of each memory cell is relative to its source electrode but the system power supply is relative to the true ground. Thus sensing may become inaccurate due to the existence of the source line bias error.

FIG. 1B shows the phenomenon of source line bias in programming a memory device in the form of population distribution (i.e. bit count) vs. read voltage coordinate system. It can be seen clearly in the figure that the entire ideal predetermined state population distribution (depicted as a dashed curve), including the lowest distribution voltage $V_L$, is shifted to the left (depicted as a solid curve) due to the source line bias. This shift may also result in a decreased judge margin (e.g. $M_1 \rightarrow M_2$) between the lowest distribution voltage $V_L$ of state population distribution and the reference voltage $V_R$ as happened in the charge loss case.

Therefore, there is a general need for non-volatile memory with high performance and high reliability. In particular, there is a need to have a non-volatile memory with mechanisms to compensate the aforementioned charge loss and source line bias in memory reading and programming operations.

SUMMARY OF THE INVENTION

In order to solve the issue of aforementioned charge loss and source line bias error, the present invention provides a novel method for programing the memory cells. The method features a pre-reading step to highlight problematic cells in previous program pattern and two pattern merging steps to combine and compensate the current program pattern with the result of verified previous program pattern in pre-reading step.

The objective of the present invention is to provide a method of compensating charge loss and source line bias in programing of non-volatile memory device. The method includes steps of reading a previous program page with a first reference voltage to make an original previous program pattern, merging the original previous program pattern and a current program pattern to make a merged program pattern, reading the previous program page with a second reference voltage to make a verified previous program pattern, and merging the verified previous program pattern and the merged program pattern to make a compensated current program pattern.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

For a more complete understanding of the embodiments, and the advantages thereof, reference is now made to the following descriptions taken in conjunction with the accompanying drawings, in which.

Figure 1A:
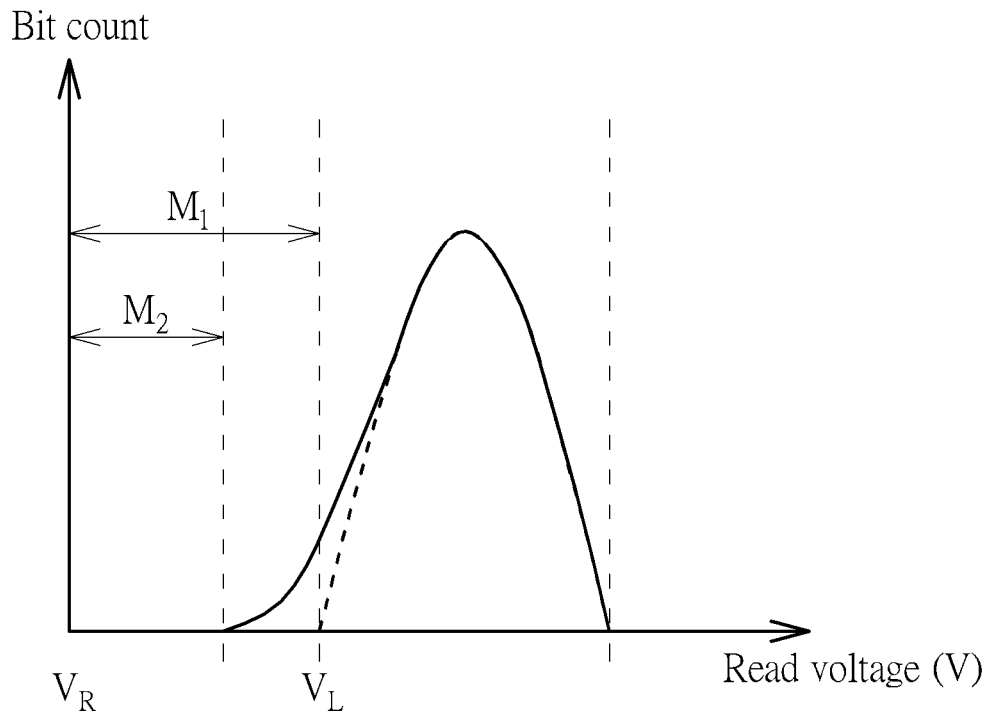
FIG. 1A and FIG. 1B are coordinate system of bit count distribution vs. read voltage showing the phenomenon of conventional charge loss and source line bias in programing a non-volatile memory cell.

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

The memory devices typically comprise one or more memory chips that may be mounted on a card. Each memory chip comprises an array of memory cells supported by peripheral circuits such as decoders and erase, write and read circuits. The more sophisticated memory devices also come with a controller that performs intelligent and higher level memory operations and interfacing. There are many commercially successful non-volatile solid-state memory devices being used today. These memory devices may employ different types of memory cells, each type having one or more charge storage element.

Figure 2:
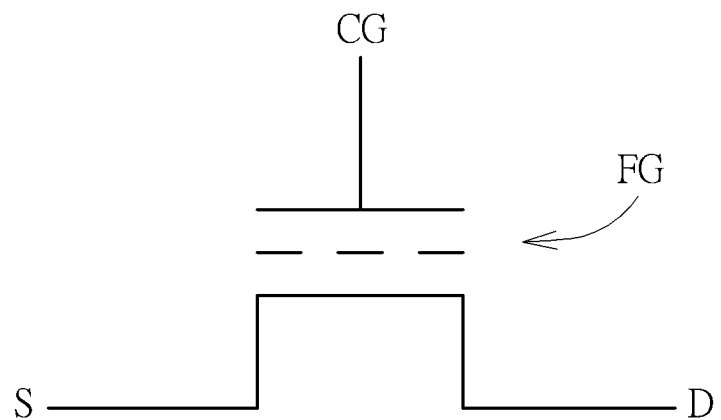
FIG. 2 illustrates schematically a non-volatile memory in the form of an EEPROM cell with a floating gate for storing charge.

FIG. 2 illustrates schematically a non-volatile memory in the form of an EEPROM cell with a floating gate FG for storing charge. The amount of current that can flow through the channel from source S to drain D depends on the voltage on the control gate CG and the amount of charge residing on the intervening floating gate FG. An electrically erasable and programmable read-only memory (EEPROM) has a similar structure to EPROM, but additionally provides a mechanism for loading and removing charge electrically from its floating gate upon application of proper voltages without the need for exposure to UV radiation.

In practice, the memory state of a cell is usually read by sensing the conduction voltage or current across the source and drain of the cell when a reference voltage is applied to the control gate. Thus, for each given charge on the floating gate of a cell, a corresponding conduction voltage or current with respect to a fixed reference control gate voltage may be detected. Similarly, the range of charge programmable onto the floating gate defines a corresponding threshold voltage window or a corresponding conduction current window.

In the usual two-state EEPROM cell, at least one voltage or current breakpoint level is established so as to partition the conduction window into two regions. When a cell is read by applying predetermined, fixed voltages, its source/drain current is resolved into a memory state by comparing with the breakpoint level (reference voltage $V_R$ or reference current $I_R$). If the voltage or current read is higher than that of the breakpoint level, the cell is determined to be in one logical state (e.g., a "0" state). On the other hand, if the current is less than that of the breakpoint level, the cell is determined to be in the other logical state (e.g., a "1" state). Thus, such a two-state cell stores one bit of digital information. An EEPROM cell may be designed to have more memory state, such as four-state cell (e.g. states "0", "1", "2" and "3"). A reference voltage source, which may be externally programmable, is often provided as part of a memory system to generate the breakpoint level voltage.

Figure 3:
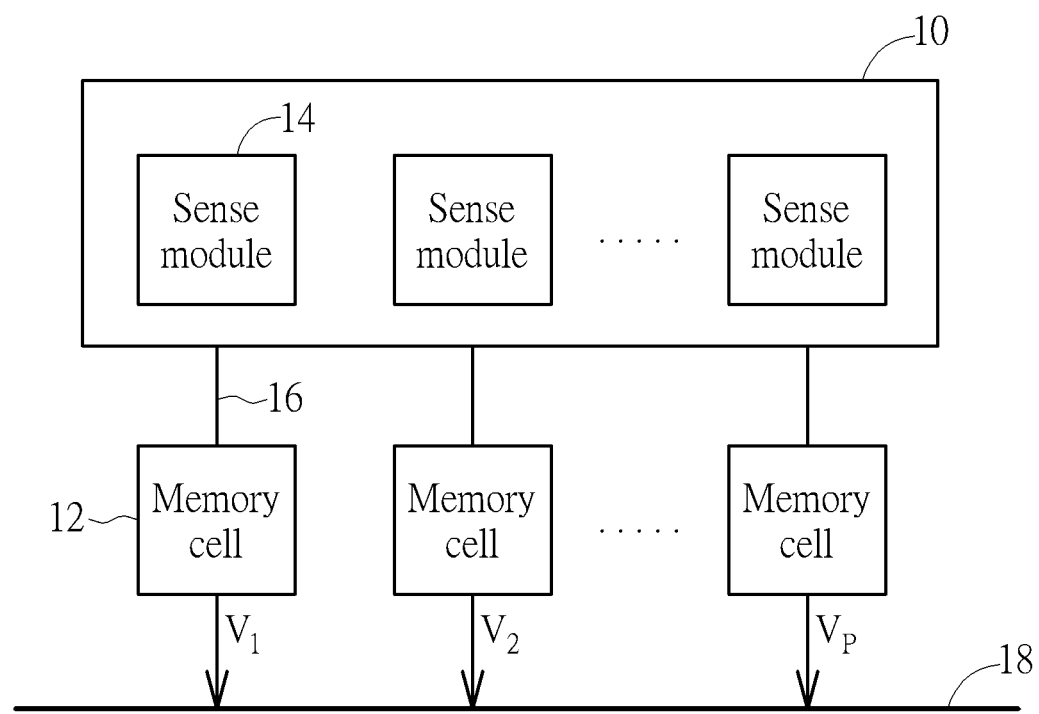
FIG. 3 illustrates a read/write circuits operating on a page of memory cells simultaneously.

FIG. 3 illustrates a read/write circuits operating on a page of memory cells simultaneously. A page of memory cells may include multiple memory cells 12 (e.g. 128-bit) in a row. Each sense module 14 in the read/write circuits 10 is coupled to a corresponding memory cell 12 via a bit line 16. For example, a sense module 14 senses the conduction voltage $V_1$ of a memory cell 12. The conduction flows from the sense module 14 through the bit line 16 into the drain of the memory cell 12 and out from the source before going through a source line 18 to ground. In an integrated circuit chip, the sources of the memory cells in a memory array are all tied together as multiple branches of the source line 18 connected to some external ground point of the memory chip.

As compared to conventional and regular reading/programming schemes, the reading/programming method of present invention utilizes pre-reading steps and merging steps before regular programing to compensate the cells of current programming by verifying the problematic cells, e.g. those with severe charge loss or source line bias issue, in previous programming. The problematic cells in previous programming would be highlighted and demarcated as low "L" state (i.e. the state more conducting) beforehand in predetermined current program pattern before regular current programming. In this way, the current program pattern would have problematic cells with compensated state to be read/programmed more correctly or less miss-identified.

Figure 4:
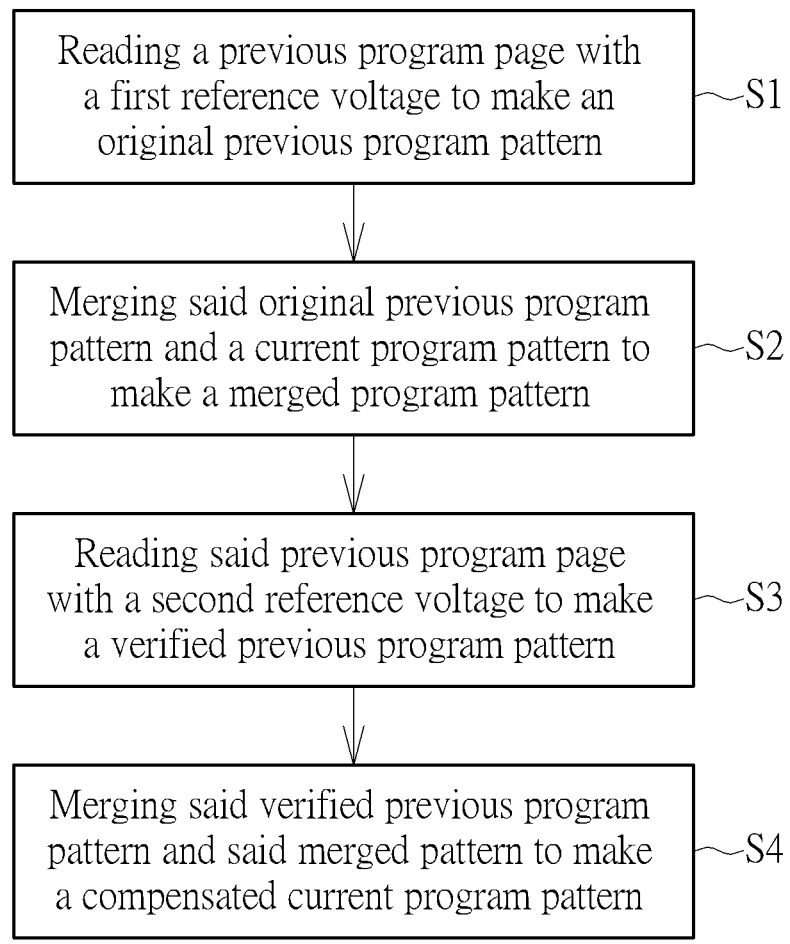
FIG. 4 is a flow diagram showing the pre-reading method for compensating charge loss and source line bias issue in programing of non-volatile memory device in accordance with one embodiment of the invention.

FIG. 4 is a flow diagram showing the pre-reading method for compensating charge loss and source line bias issue in programing of non-volatile memory device in accordance with one embodiment of the invention. The steps of the pre-reading method are summarized below.

STEP S1: reading a previous program page with a first reference voltage to make an original previous program pattern, wherein said previous program page comprises multiple said memory cells.

STEP S2: merging said original previous program pattern and a current program pattern to make a merged program pattern.

STEP S3: reading said previous program page with a second reference voltage to make a verified previous program pattern.

STEP S4: merging said verified previous program pattern and said merged program pattern to make a compensated current program pattern Detailed description of those steps will be provided now in a preferred embodiment with reference to FIGS. 5-8.

Figure 1B:
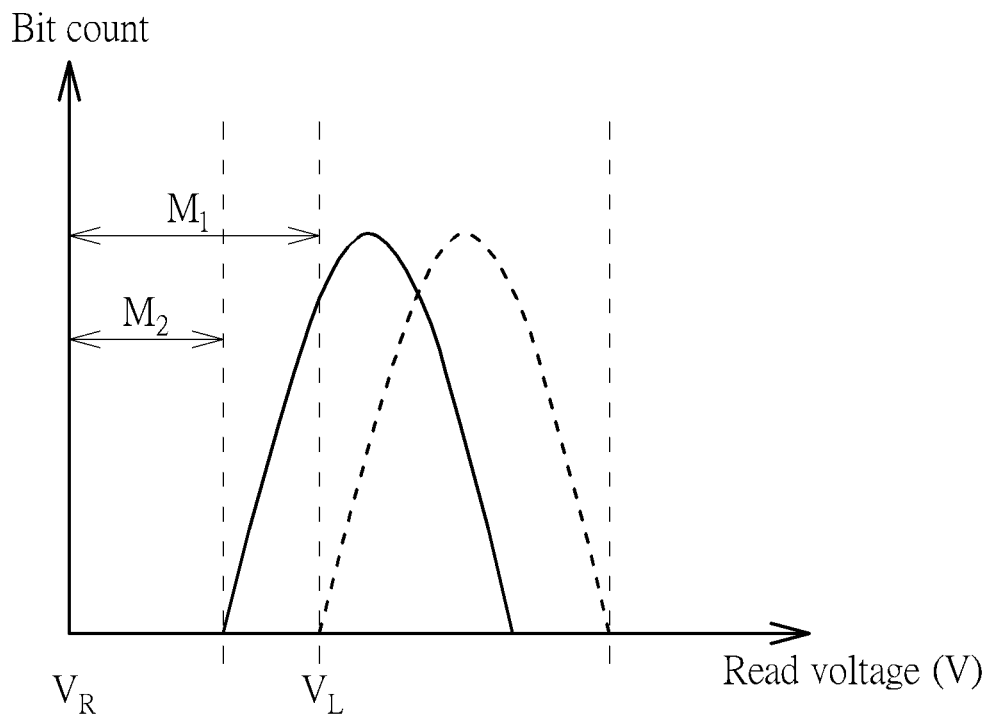
Figure 5:
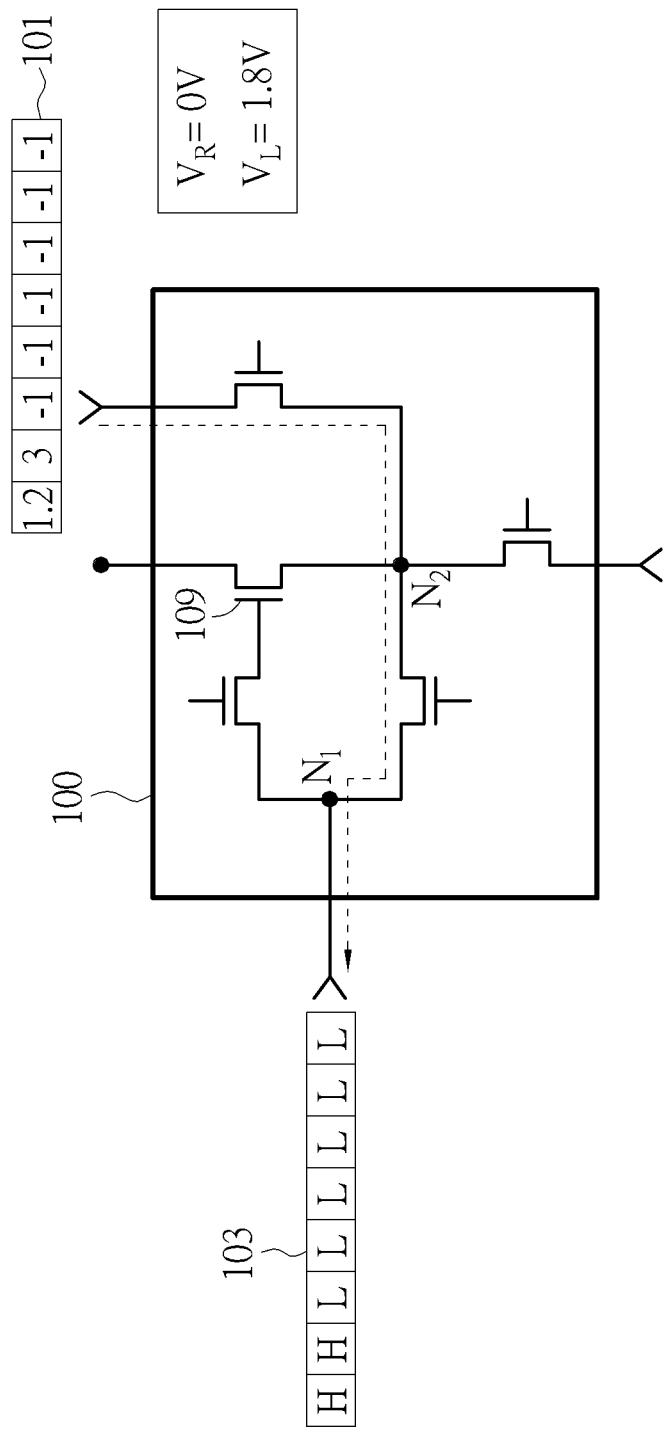
FIG. 5 is a schematic diagram illustrating the operation of a pre-read module in step S1 of the method according to the preferred embodiment of the invention.

Please refer first to FIG. 5, which is a schematic diagram illustrating a pre-read module 100 according to the preferred embodiment of the invention. In this embodiment, an exemplary program page with 8 memory cells (8-bit) is used to express the state change during the reading and merging actions in the pre-read method of present invention. The first reference voltage $V_R$ is set at 0V in this stage as a voltage breakpoint level to determine a read cell into a first memory state (e.g. high "H" state) or a second memory state (e.g. low "L" state). The lowest distribution voltage $V_L$ in the ideal high "H" state population distribution (as shown in FIG. 1A or 1B) is set at 1.8V. There will be a predetermined 1.8V judge margin between the two memory states.

In step S1, a previous program page 101 with respective cell voltages (1.2, 3, −1, −1, −1, −1, −1, −1) is read by the pre-read module 100 with the first reference voltage $V_R$. In the reading step, the memory cell with voltage level lower than the first reference voltage $V_R$ will be demarcated into a low "L" state, while the memory cell with voltage level higher than the first reference voltage $V_R$ will be demarcated into a high "H" state. Accordingly, since the first reference voltage $V_R$ in this reading step is set at 0V, a result of program pattern with respective cell states (H, H, L, L, L, L, L, L) is read from the previous program page 101 by pre-read module 100. This program pattern discerned with respect to the first reference voltage $V_R$ will be hereinafter referred as an original previous program pattern 103 to facilitate the description. Thereafter, the original previous program pattern 103 will be sent and stored in a node $N_1$.

As it is shown in the figure, although the first memory cell of the previous program page 101 is demarcated as a high "H" state, it only have a 1.2V voltage level, which is a level lower than the predetermined lowest distribution voltage $V_L$ (=1.8V) in the ideal high "H" state population distribution. This means the first memory cell of the previous program page 101 may be a problematic cell suffering severe charge loss and source line bias issue, and it is probable that this first cell will be demarcated as a low "L" state after numerous programming of this page. The first pre-reading step is performed to express and makes the cell state pattern of a program page in standard programming situations, wherein no cell, even the problematic cells, is erroneously read.

In step S2, the original previous program pattern 103 stored in node $N_1$ will be merged with a current program pattern 105 to make a merged program pattern 111. This step involves several actions. Please refer to FIG. 6. First, a current program pattern 105 is loaded by the pre-read module 100 to a node $N_2$. The node $N_2$ is connected to a drain of a merge gate 109. The merge gate 109 is gated by the node N1 and has a source connecting to a voltage $V_1$, wherein the voltage $V_1$ in this stage is set at 0V (i.e. logic "0" voltage).

Figure 6:
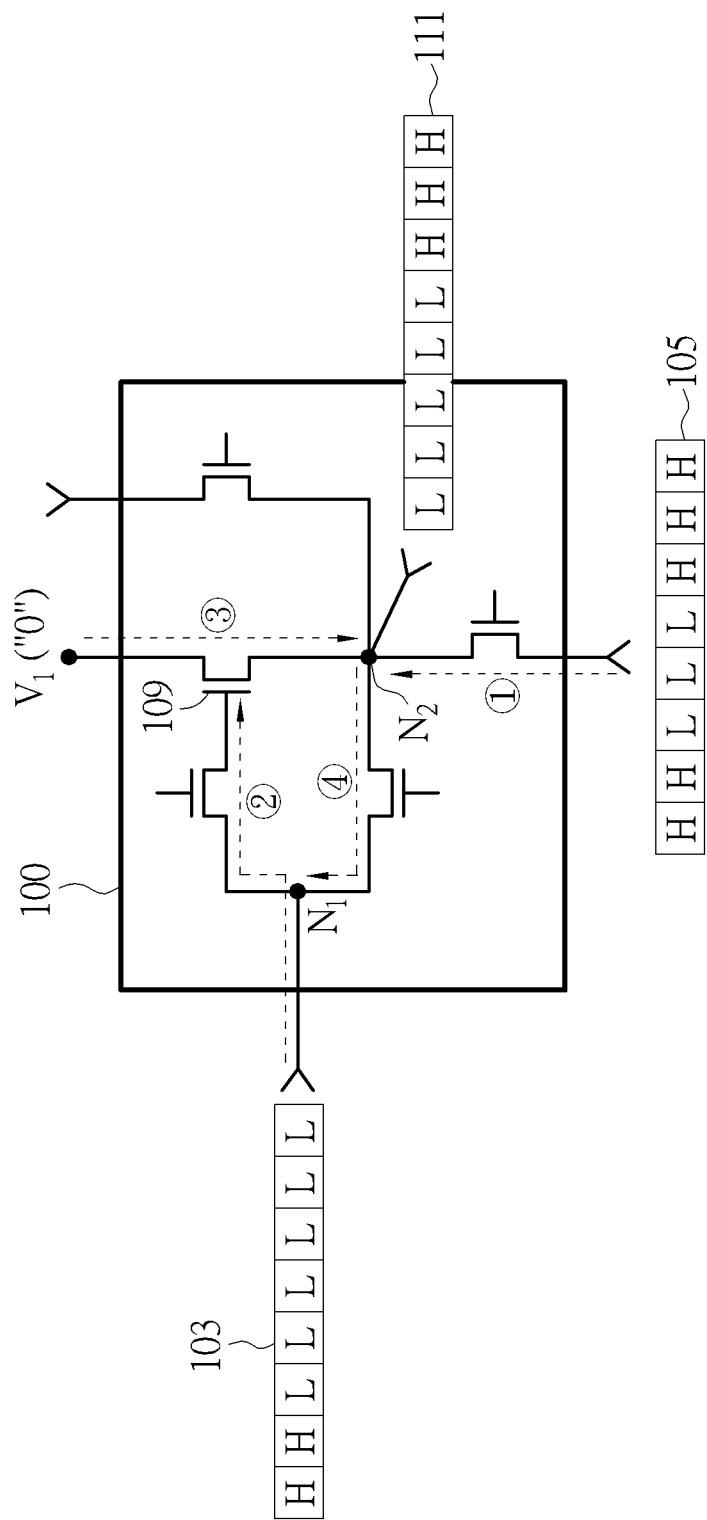
FIG. 6 is a schematic diagram illustrating the operation of a pre-read module in step S2 of the method according to the preferred embodiment of the invention.

Refer still to FIG. 6. After the current program pattern 105 is loaded to the node $N_2$, the original previous program pattern 103 stored in the node $N_1$ is applied as a gate voltage pulse to the merge gate 109. The voltage pulse with the states of original previous program pattern 103 will turn on or turn off the merge gate 109 with respect to their corresponding memory cells. For example, the first and second memory cells in the original previous program pattern 103 are in high "H" state. The voltage level of high "H" state in these two cells will open the merge gate 109 and allow the voltage $V_1$ in source of the merge gate 109 to be connected with the node $N_2$. On the other hand, the third to eighth memory cells in the original previous program pattern 103 are in low "L" state. Their voltage level would not open the merge gate 109 and the voltage $V_1$ in source of the merge gate 109 is not allowed to be connected with the node $N_2$.

Through the aforementioned gating mechanism by using the original previous program pattern 103 as the gate voltage, the original previous program pattern 103 stored in node $N_1$ may be merged with the current program pattern 105 loaded in the node $N_2$. Since the merge gate 109 is opened in programing of the corresponding first and second memory cells, the high "H" states of first two memory cells in the current program pattern 105 would be replaced with the low "L" state by the source voltage $V_1$ in low "L" state, while the states of other memory cells remain unchanged. The modified current program pattern in node $N_2$ is referred hereinafter as a merged program pattern 111, as shown in FIG. 6. The merged program pattern 111 includes combined cell states for respective memory cells in the page. This merge action intents to replace the states of memory cells in the current program pattern 105 corresponding to the high "H" state memory cells in the original previous program pattern 103 with common low "L" state, even for those high "H" state memory cells in previous program page 101 with voltage lower than the predetermined lowest distribution voltage $V_L$ of the ideal high "H" state population distribution. After the merging action, the merged program pattern 111 will be sent to node $N_1$. The original previous program pattern 103 stored in node $N_1$ is replaced by the merged program pattern 111.

Figure 7:
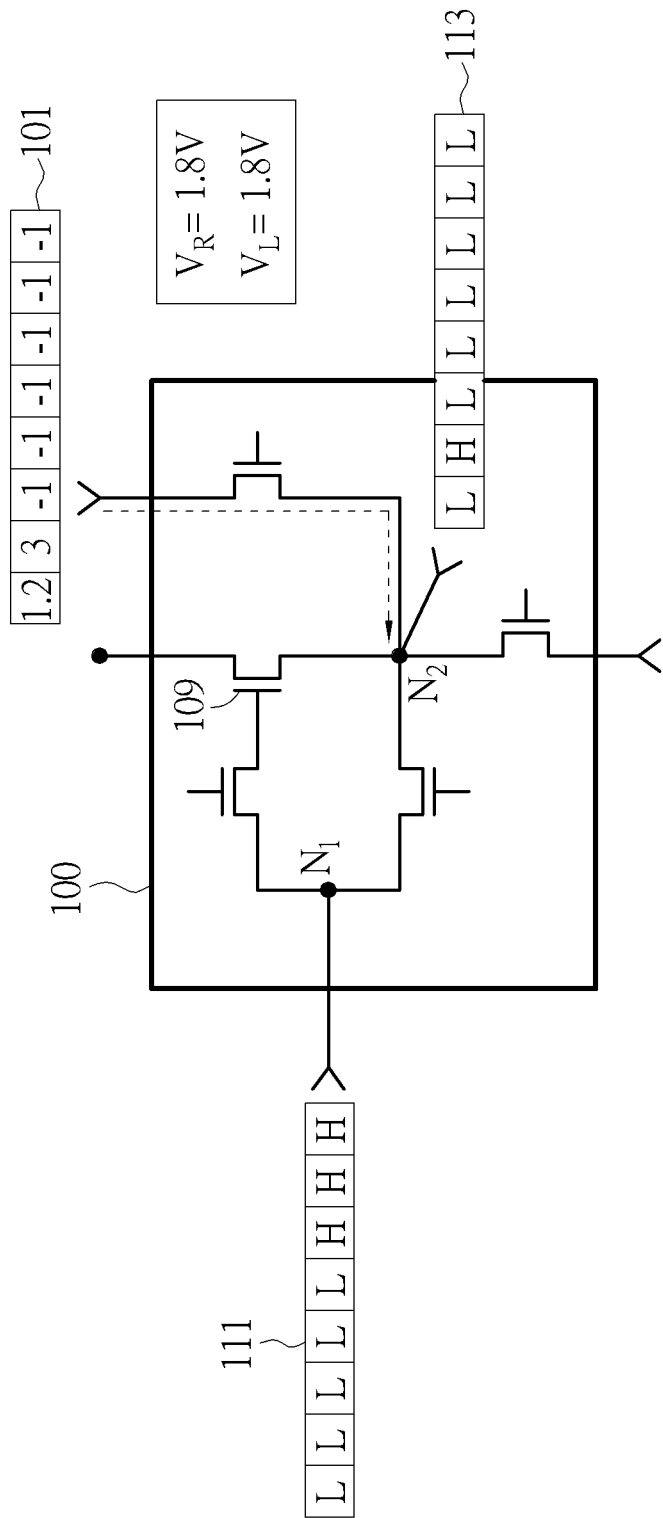
FIG. 7 is a schematic diagram illustrating the operation of a pre-read module in step S3 of the method according to the preferred embodiment of the invention.
Figure 8:
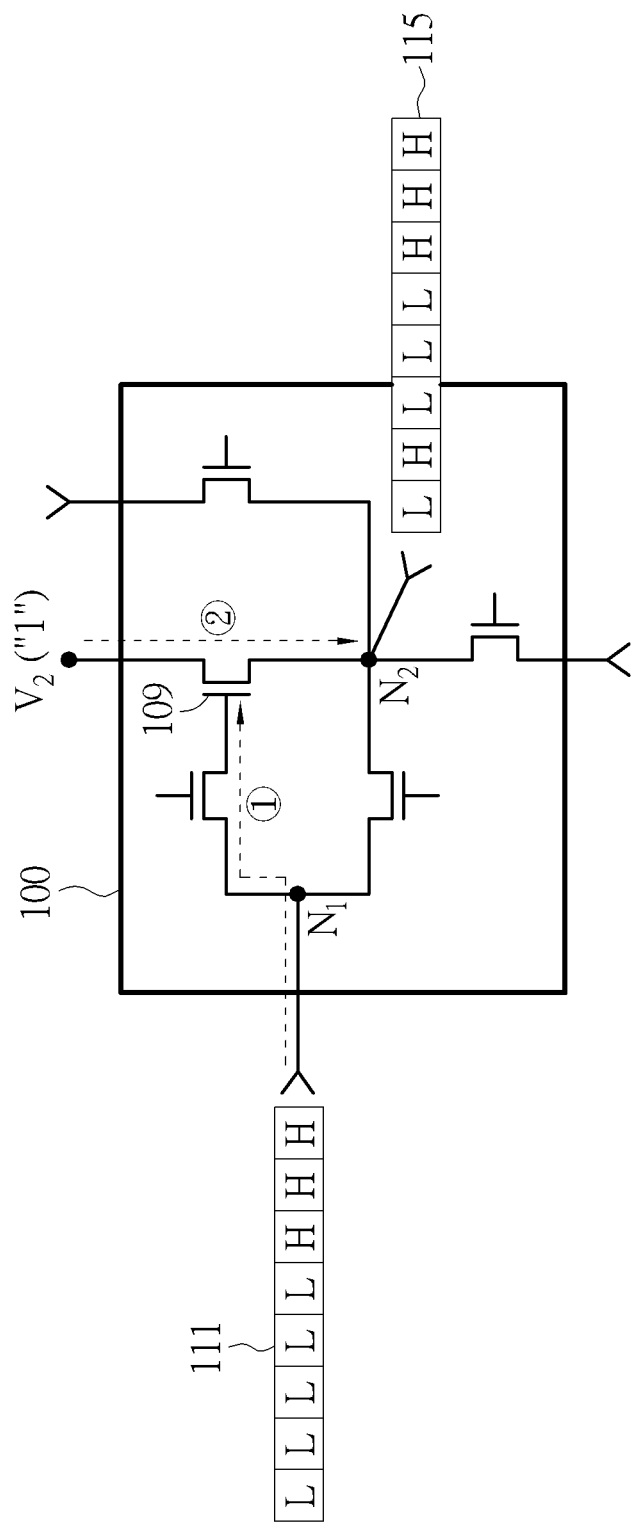
FIG. 8 is a schematic diagram illustrating the operation of a pre-read module in step S4 of the method according to the preferred embodiment of the invention.

In step S3, as shown in FIG. 7, the previous program page 101 with respective cell voltages (1.2, 3, −1, −1, −1, −1, −1, −1) is read again. However, in this stage, it is read with a second reference voltage $V_R$, wherein the second reference voltage $V_R$ is set at 1.8V exactly equal to the predetermined lowest distribution voltage $V_L$ in the ideal high "H" state population distribution. This means the memory cells in this program page suffering charge loss or source line bias issue (e.g. the first memory cell with decreased voltage level 1.2V) will be demarcated into low "L" state in this verifying pre-reading action. Accordingly, a program pattern with respective cell states (L, H, L, L, L, L, L, L) different from the original previous program pattern 103 in step S1 is read from the previous program page 101. This program pattern discerned by using relatively high second reference voltage $V_R$ will be hereinafter referred as a verified previous program pattern 113, which means the problematic memory cells in the program page are verified and highlighted. The verified previous program pattern 113 will be sent and stored in the node $N_2$. In the meantime, the program pattern stored in the node $N_1$ is the merged program pattern 111 derived from step S2.

In step S4, the verified previous program pattern 113 stored in the node $N_2$ will be merged with the merged program pattern 111 stored in the node $N_1$ to make a compensated current program pattern 115. This step involves several actions. Please refer to FIG. 8. First, the merged program pattern 111 stored in the node $N_1$ is applied as a gate voltage pulse to the merge gate 109, wherein the merge gate 109 has a source connecting to a voltage $V_2$ with a voltage level set at supply voltage (i.e. logic "1" voltage). Please note that the voltage $V_2$ in step S4 is different from the voltage $V_1$ in step S2.

The voltage pulse with the states of merged program pattern 111 will turn on or turn off the merge gate 109 with respect to their corresponding memory cells. For example, the last three memory cells are in high "H" state in the merged program pattern 111. The voltage of high "H" state in these three cells would open the merge gate 109 and allow the aforementioned voltage $V_2$ in source of the merge gate 109 to be connected with the node $N_2$. On the other hand, the first to fifth memory cells in the merged program pattern 111 are in low "L" state. Their voltage level is not sufficient to open the merge gate 109 and the voltage $V_2$ in source of the merge gate 109 is accordingly not allowed to be connected with the node $N_2$.

Through the aforementioned gating mechanism by using the merged program pattern 111 as the gate voltage, the merged program pattern 111 stored in node $N_1$ may be merged with the verified previous program pattern 113 stored in the node N2. Since the merge gate 109 is opened in programing of the corresponding last three memory cells in the page, the low "L" states of the last three memory cells in the verified previous program pattern 113 would be replaced with the high "H" state by the source voltage $V_2$ in high "H" state, while the states of other memory cells remain unchanged. Therefore, the verified previous program pattern 113 stored in node $N_2$ is modified into a compensated current program pattern 115. In comparison to the original current program pattern 105, the compensated current program pattern 115 includes and highlights the problematic first cells with low "L" state, while other memory cells remain unchanged. Thereafter, current programming action will be performed based on the compensated current program pattern 115.

With memory cells of the current program page corresponding to the verified problematic cells with smaller determination window in previous program result are highlighted as low "L" state, the highlighted low "L" state problematic cell may be compensated and reprogrammed with correct voltage level in later programming, therefore the charge loss and source line bias issue of standard high "H" state population distribution as described in FIGS. 1A and 1B after numerous programming or long-time retention may be significantly improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of compensating charge loss and source line bias in programing of non-volatile memory device, comprising:

reading a previous program page with a first reference voltage to make an original previous program pattern, wherein said previous program page comprises multiple memory cells;

merging said original previous program pattern and a current program pattern to make a merged program pattern;

reading said previous program page with a second reference voltage to make a verified previous program pattern; and merging said verified previous program pattern and said merged program pattern to make a compensated current program pattern, wherein said second reference voltage is higher than said first reference voltage, wherein each said memory cell in said original previous program pattern, said merged program pattern, said verified previous program pattern and said compensated current program pattern is in one of different states, and the number of said different states in said original previous program pattern, said merged program pattern, said verified previous program pattern and said compensated current program pattern is the same.

2. The method of compensating charge loss and source line bias in programing of non-volatile memory device of claim 1, wherein said reading a previous program page with said first reference voltage to make an original previous program pattern further comprise:

reading a voltage of each said memory cell in said previous program page, wherein said memory cell is in a low "L" state when said voltage of said memory cell is lower than said first reference voltage, and said memory cell is in a high "H" state when said voltage of said memory cell is higher than said first reference voltage; and storing said original previous program pattern in a first node.

3. The method of compensating charge loss and source line bias in programing of non-volatile memory device of claim 2, wherein merging said original previous program pattern and said current program pattern to make said merged program pattern further comprises:

loading said current program pattern to a second node, wherein said second node is connected to a drain of a merge gate, and said merge gate has a source connecting to a first voltage;

controlling said merge gate according to said original previous program pattern, wherein said merge gate is opened when said memory cell in said original previous program pattern is in said high "H" state, and said merge gate is closed when said memory cell in said original previous program pattern is in said low "L" state; and storing said merged program pattern in said first node.

4. The method of compensating charge loss and source line bias in programing of non-volatile memory device of claim 3, wherein said reading a previous program page with a second reference voltage to make a verified previous program pattern further comprise:

reading a voltage of each said memory cell in said previous program page, wherein said memory cell is in a low "L" state when said voltage of said memory cell is lower than said second reference voltage, and said memory cell is in a high "H" state when said voltage of said memory cell is higher than said second reference voltage; and storing said verified previous program pattern in said second node.

5. The method of compensating charge loss and source line bias in programing of non-volatile memory device of claim 4, wherein merging said verified previous program pattern and said merged program pattern to make a compensated current program pattern further comprises:

controlling said merge gate according to said merged program pattern, wherein said merge gate is opened when said memory cell in said merged program pattern is in said high "H" state, and said merge gate is closed when said memory cell in merged program pattern is in said low "L" state, and said source of said merge gate connects to a second voltage.

6. The method of compensating charge loss and source line bias in programing of non-volatile memory device of claim 1, wherein said first reference voltage discriminates each said memory cell as a high "H" state or a low "L" state, and said second reference voltage is a lowest distribution voltage in an ideal predetermined population distribution programmed to be in high "H" state.

7. The method of compensating charge loss and source line bias in programing of non-volatile memory device of claim 6, wherein said first reference voltage is 0V.

8. The method of compensating charge loss and source line bias in programing of non-volatile memory device of claim 6, wherein said second reference voltage is 1.8V.

9. The method of compensating charge loss and source line bias in programing of non-volatile memory device of claim 6, wherein a difference between said second reference voltage and said first reference voltage is a predetermined judge margin in discriminating a state of said memory cell.

* * * * *